United States Patent [19]

Clarke

[11] Patent Number: 5,677,622
[45] Date of Patent: Oct. 14, 1997

[54] CURRENT SENSOR USING A SAGNAC INTERFEROMETER AND SPUN, SINGLE MODE BIREFRINGENT OPTICAL FIBER TO DETECT CURRENT VIA THE FARADAY EFFECT

[75] Inventor: Ian Grainge Clarke, Sydney, Australia

[73] Assignee: The University of Sydney, Sydney, Australia

[21] Appl. No.: 744,555

[22] Filed: Nov. 6, 1996

Related U.S. Application Data

[63] Continuation of Ser. No. 256,093, filed as PCT/AU92/00680, Dec. 22, 1992, abandoned.

[30] Foreign Application Priority Data

Dec. 24, 1991 [AU] Australia .................. PL0193

[51] Int. Cl.$^6$ ........................................ G01R 31/00
[52] U.S. Cl. ................................ 324/96; 356/351
[58] Field of Search ........................ 324/96, 117 R; 356/345, 351

[56] References Cited

U.S. PATENT DOCUMENTS

| | | |
|---|---|---|
| 4,370,612 | 1/1983 | Puech et al. . |
| 4,542,338 | 9/1985 | Arditty et al. . |
| 4,545,682 | 10/1985 | Greenwood . |
| 4,634,852 | 6/1987 | Shaw . |
| 4,773,758 | 9/1988 | Shaw . |
| 4,848,910 | 7/1989 | Dupraz . |

FOREIGN PATENT DOCUMENTS

| | | |
|---|---|---|
| A0361832 | 9/1989 | European Pat. Off. . |
| A2190744 | 5/1987 | United Kingdom . |
| 2251940 | 7/1992 | United Kingdom . |
| WOA8911110 | 11/1989 | WIPO . |

OTHER PUBLICATIONS

Optics Letters, vol. 13, No. 10, Oct. 1988, Washington US pp. 844–846, Bassett "Design Principle for a Circularly Birefringent Optical Firbre".

Revue Generale de l'Electricite, No. 4, Apr. 1990, Paris FR Royer et al. "Capteur de Courant a Fibre Optique" pp. 62–67.

IEEE Transactions on Instrumentation and Measurement, vol. 39, No. 1, Jan. 1990, New York, U.S., Nicati et al. "Numerical Analysis of Second Order Polarization . . . ", pp. 219–224.

*Primary Examiner*—Vinh P. Nguyen
*Assistant Examiner*—Russell M. Kobert
*Attorney, Agent, or Firm*—Jacobson, Price, Holman & Stern, PLLC

[57] ABSTRACT

A current sensor which makes use of the Faraday effect, which is patterned on a Sagnac interferometer and which employs a coil of spun birefringent optical fibre for sensing the magnitude of current flowing through a conductor about which the sensor is, in use, located. The sensor in its preferred form comprises a coil (1) of spun single mode birefringent optical fibre (11), the coil being arranged to locate about a conductor (12) through which current flow occurs. A beam splitting device (22) in the form of a 3*3 coupler is coupled with the ends of the coil fibre and is arranged to launch counter-propagating light beams into the respective ends of the coil fibre. A lasing light source (16) is optically coupled to the beam splitting device by way of a 2*2 coupler (21), and detectors (18) which are arranged to detect a phase shift between the polarisation modes of the counter-propagated light beams are optically coupled to the ends of the coil fibre by way of the beam splitting device.

11 Claims, 3 Drawing Sheets

CURRENT SENSOR USING A SAGNAC INTERFEROMETER AND SPUN, SINGLE MODE BIREFRINGENT OPTICAL FIBER TO DETECT CURRENT VIA THE FARADAY EFFECT

This is a continuation of application Ser. No. 08/256,093, filed as PCT/AU92/00680 Dec. 22, 1992, which was abandoned upon the filing hereof.

TECHNICAL FIELD

This invention relates to a sensor, which employs a sensor element composed of spun birefringent optical fibre, for sensing current flow through a conductor.

BACKGROUND ART

Current sensors which employ optical fibre are used in high voltage systems, for example in electricity generating and distribution systems. Such sensors make use of the Faraday effect to provide a measure of electric current flowing through a conductor and they provide advantages over conventional measuring arrangements that incorporate current transformers. The sensors are light in weight, compact, relatively economical to produce and, most importantly, are electrically insulating.

When light is subjected to the influence of a magnetic field, with the direction of light propagation aligned with the magnetic field, the right-hand circularly polarised mode travels faster than the left-hand circularly polarised mode. This produces a phase shift, the Faraday effect, between the polarisation modes, and the degree of phase shift is proportional to the strength of the magnetic field. Hence, the phase shift is proportional to the current that produces the magnetic field, and the magnitude of current can be inferred from a measurement of the degree of phase shift. However, the Faraday effect is weak and a large number of turns of optical fibre must be wound around a conductor in order to achieve the fibre length required to provide for a measurable phase shift.

Spun birefringent optical fibre might be employed with advantage in the formation of coils having large numbers of turns because, unlike ordinary telecommunications optical fibre, spun birefringent fibre can be wound with a small radius without seriously affecting polarisation properties. This facilitates the manufacture of compact current sensors. However, a problem that arises from the use of spun birefringent optical fibre is that the phase shift between intrinsic polarisation modes of such fibre changes with temperature. A small change in temperature may produce the same phase shift as a large change in current flow through the conductor and, whilst various techniques have been proposed to compensate for the temperature sensitivity of spun birefringent fibre, these involving the introduction of temperature sensitive orthoconjugate reflectors and broadband systems with back reflection.

DISCLOSURE OF THE INVENTION

The present invention is directed to a current sensor which is arranged to reduce the effects of temperature sensitivity and which facilitates the fabrication of a compact current sensing device which, depending upon its construction, is suitable for use in various applications Broadly defined, the present invention provides a sensor for detecting current flow through a conductor and which comprises a sensor element composed of spun single mode birefringent optical fibre which is arranged to be located in juxtaposition to the conductor. A beam splitting device is coupled optically with the ends of the optical fibre and is arranged to provide for entry of counter-propagating light beams into the respective ends of the optical fibre. A light source is optically coupled to the beam splitting device, and a detector, which is arranged to detect a phase shift between the polarisation modes of the counter-propagated light beams, is optically coupled to the ends of the optical fibre by way of the beam splitting device. The sensor element preferably comprises a coil of the optical fibre so that it may be located about an axially extending current conductor. However, when the conductor itself is in the form of a coil the sensor element may comprise a length of the optical fibre for location axially within the conductor.

The sensor is patterned on a Sagnac interferometer, this enabling the employment of spun single mode birefringent optical fibre in formation of the coil. The magnitude of current flowing through a conductor is, in use of the sensor, determined as a measure of the degree of phase shift between the polarisation modes of the counter propagated light beams.

The sensor may be employed solely for detecting the existence of current flow, for example in an earth conductor under fault conditions. However, the sensor in a preferred form may be used for detecting the magnitude of current flow in a conductor and, in such context, the sensor may be employed to provide a measure of magnitude or an indication of the existence of a predetermined magnitude.

The beam splitting device is preferably selected to exhibit temperature stable retardance to avoid the need for introducing a compensating temperature dependent variable. To this end, the beam splitting device should exhibit low retardance relative to the coil fibre.

The optical coupling between the beam splitting device and the ends of the optical fibre is preferably arranged such that the angular relationship between the optical fibre core and the polarisation of the light at any instant in time is substantially the same at both ends of the optical fibre. If this feature is not present in the sensor, then the light source should comprise a source of short wavelength coherent light.

The beam splitting device preferably comprises an optical fibre coupler, typically a 2×2 coupler, but it may alternatively be constituted by a bulk optical beam splitter such as a half-silvered mirror. The beam splitting device most preferably comprises a 4×4 coupler and three detector elements preferably are coupled to the ends of the optical fibre in order to permit determination to be made of the magnitude and direction of current passing through the conductor.

The light source would normally comprise a source of coherent or near coherent light and, thus, would normally comprise a laser or a near-lasing device, such as a super luminescent diode, where the magnitude of current flow is to be measured. However, the light source may comprise a source of non-coherent light in certain applications of the sensor, for example when the mere existence of current is to be sensed.

The detector may be connected either directly or indirectly to the beam splitting device and the detector preferably is in the form of a device which functions to measure the intensity of interfering beams.

The invention will be more fully understood from the following description of a preferred embodiment of a current sensor, the description being provided with reference to the accompanying drawings.

MODE FOR CARRYING OUT THE INVENTION

Figure 1:
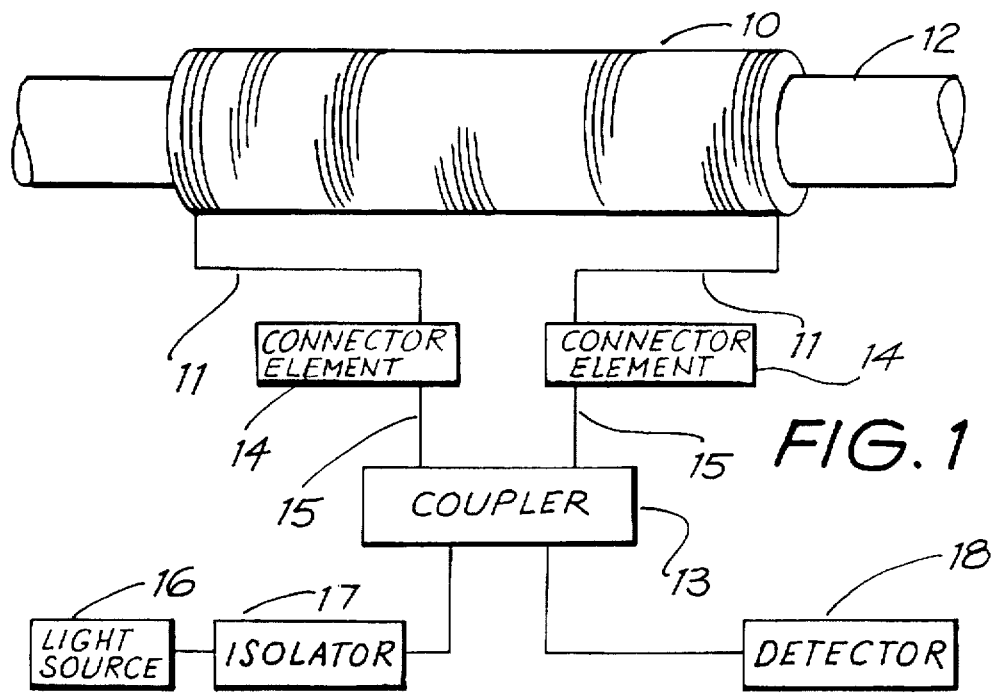
FIG. 1 shows a block diagrammatic representation of the current sensor and a portion of a conductor which is surrounded by the current sensor and through which current is passed.
Figure 2:
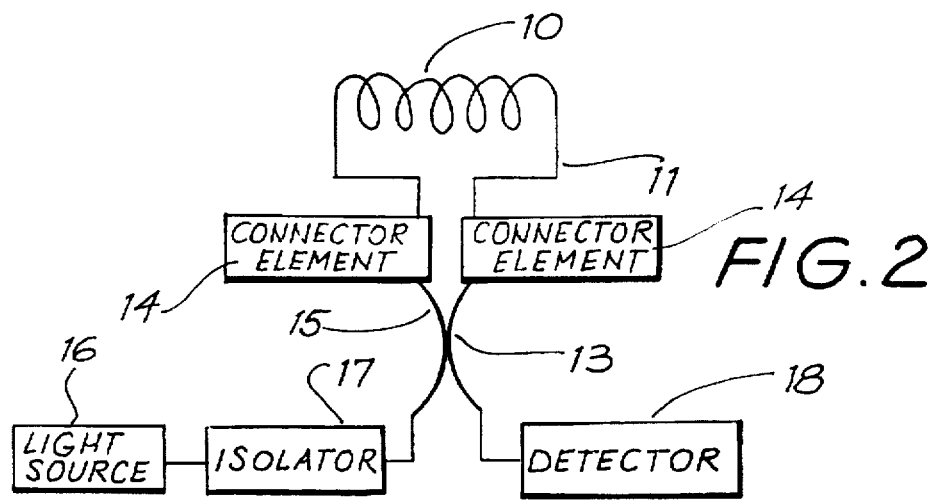
FIGS. 2 and 3 show schematic representations of alternative embodiments of the sensor, both of which include a 2×2 coupler as a beam splitting device.

As illustrated in FIGS. 1 and 2, the current sensor comprises a coil 10 of spun single mode birefringent optical fibre 11. The coil 10 typically has a length in the order of 50 cm, a diameter of 10 cm and is wound with less than 100 m to a maximum of 500 m of optical fibre. In use of the sensor the coil 10 is located concentrically about a conductor 12 through which current normally flows.

The coil fibre may comprise form birefringent or stress birefringent fibre (for example, elliptical core fibre or bowtie fibre), and it preferably comprises a bowtie fibre having a core diameter in the order of 4 micrometer and a cladding diameter in the order of 80 micrometer. Also, the fibre has a spun pitch length of 4.8 mm and an unspun beat length of 2.4 mm.

A 2×2 fused tapered coupler 13 having a low intrinsic retardance (i.e., less than about 10°) is spliced to the ends of the coil fibre 11 by connector elements 14 which permit a twisting join (as hereinafter described) to be made between the coupler leads 15 and the ends of the coil fibre.

A light source 16 in the form of a laser diode, which has a lasing wavelength in the order of 670 nm, is coupled to both ends of the coil fibre 11 by the coupler 13, and an isolator 17 is provided to prevent reflections back into the light source. Light from the light source 16 is split by the coupler 13 into two counter-propagating beams which enter the respective ends of the coil fibre 11.

A detector 18 is optically coupled to the ends of the coil fibre 11 by way of the coupler 13. The detector comprises a silica photodiode and it functions to measure the intensity of interfering beams. Thus, the detector effectively detects the phase shift between polarisation modes of the counter propagated light beams.

Figure 3:
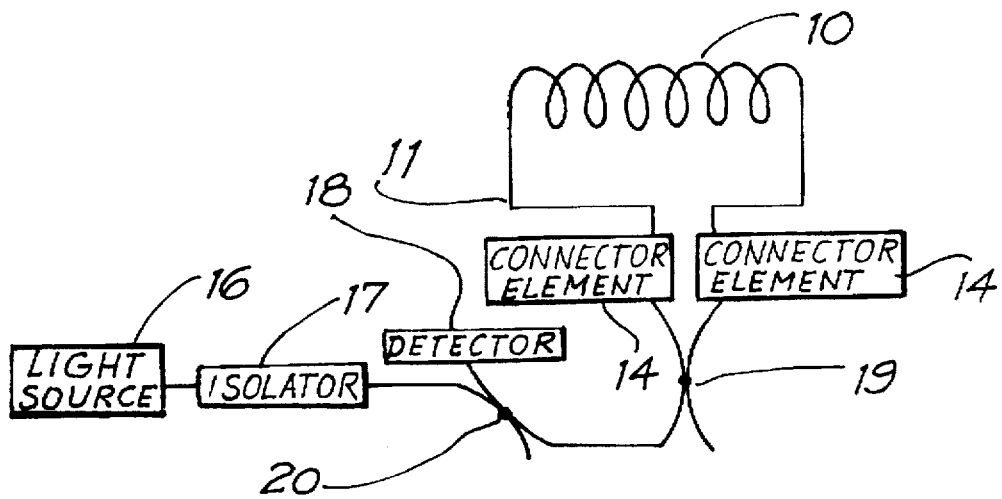

FIG. 3 shows an alternative arrangement for the sensor, in which two 2×2 couplers 19 and 20 are employed for optically coupling the light source 16 and the detector 18 to the ends of the coil fibre 11.

Figure 4:
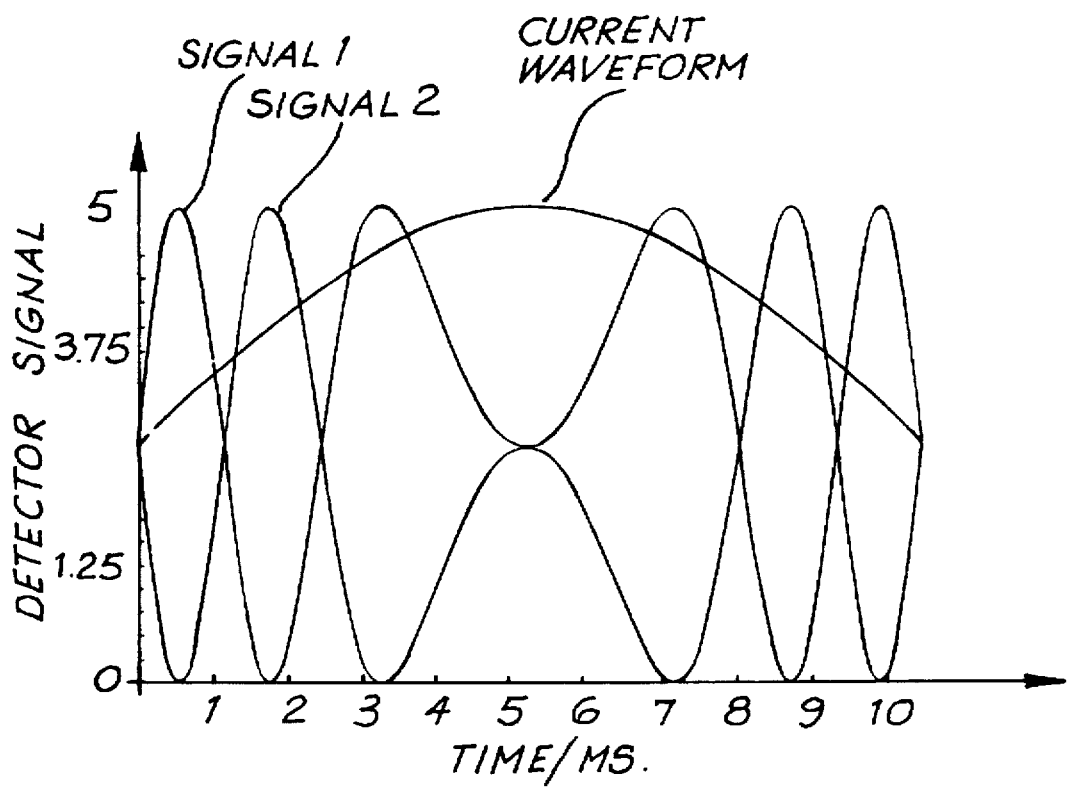
FIG. 4 shows a graphical analysis of optical signals derived as outputs from the sensor arrangements shown in FIGS. 2 and 3 together with the waveform of conductor current that is sensed by the sensor.

When a half silvered mirror or a 2×2 coupler as shown in FIGS. 2 and 3 is employed as a beam splitting device, two 180° displaced beams are available for detection, one of which may be inferred from the other so that a single detector may be employed. However, as shown in FIG. 4, when one optical signal is at a maximum the other is at a minimum and at these turning points the rate of change of light intensity with current drops to zero. Hence, the sensor becomes relatively insensitive to small changes in current. Furthermore, the direction of the current change is unclear because, when at the peak of the sinusoidal optical response, a decrease or increase in the current produces a decrease in the optical output.

Figure 5:
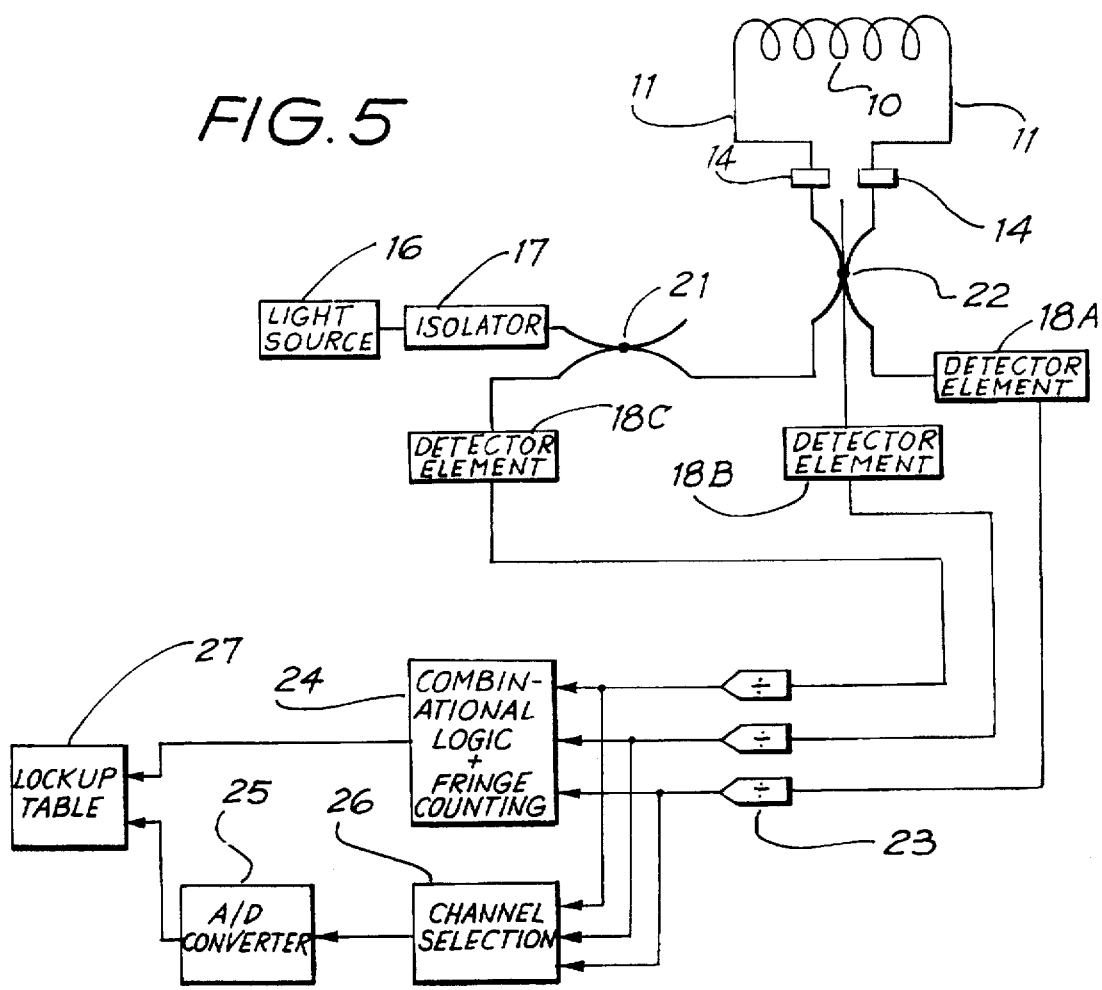
FIG. 5 shows a schematic representation of a further embodiment of the sensor, this including a 4×4 coupler as a beam splitting device.

A further, preferred arrangement for the sensor is illustrated in FIG. 5 and it shows a sensor arrangement which does at least in part avoid the difficulties that have been described above with reference to FIG. 4. In the arrangement shown in FIG. 5, a 2×2 coupler 21 and a 4×4 coupler 22 are used for optically coupling light from a single source 16 to the two ends of the coil fibre 11 and for coupling three detector elements 18A, 18B and 18C to the ends of the coil fibre. Thus, the returning light from the coil is split between three fibres and the principal advantage of this arrangement is that it enables the full waveform of the current within the conductor 12 to be reconstructed from the output of the coil 10.

Figure 6:
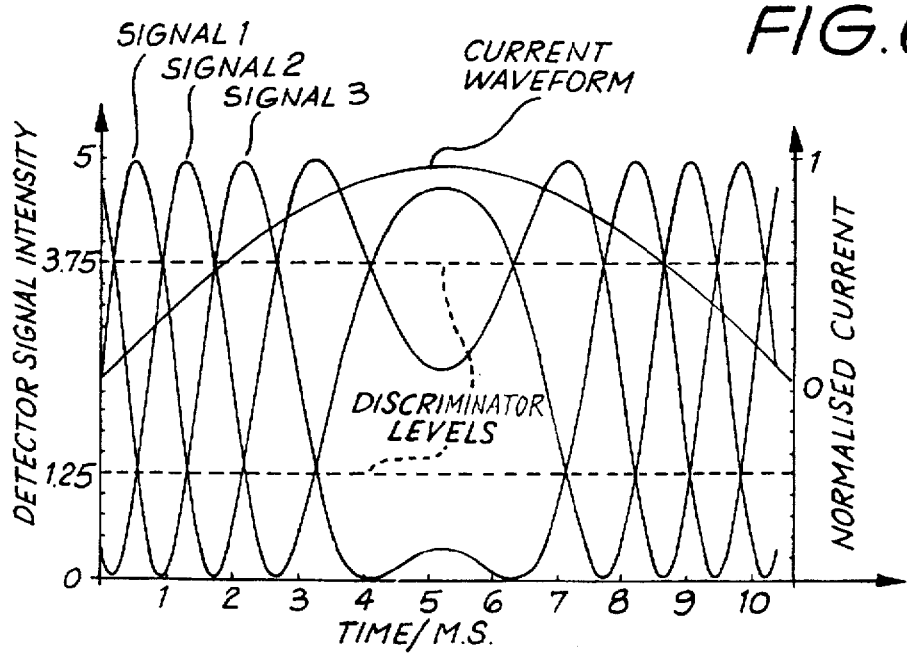
FIG. 6 shows a graphical analysis of optical signals derived as outputs from the sensor arrangements shown in FIG. 5 together with the waveform of conductor current that is sensed by the sensor.

Thus, as indicated in the graphical analysis shown in FIG. 6, at any instantaneous value of the current flowing through the conductor, one of the output signals from the coil is in a region where the light intensity changes rapidly with a change in current. This permits derivation of the current direction and magnitude.

As shown in FIG. 5, the outputs from the three detector elements 18A, 18B and 18C are applied to analogue dividers 23 which are employed to normalise the signals relative to the laser power of the source 16. Fringe counting is then performed using discriminators and combinational logic 24 which is provided to count fringes and choose the optimum region for fringe interpolation. The discriminators provide a predetermined number of pulses per fringe and the order in which the discriminators trigger is dependent upon the current direction. From this information, the fringe counting produces an eight-bit number corresponding to a coarse measure of the current. Fine resolution within each fringe section is provided by an analogue to digital (A/D) converter 25 which measures the voltage on the fringe selected by asynchronous timing networks 26. The A/D converter has a predetermined number of quantisation levels over the full voltage range of the signal and a majority of these levels fall within discriminator levels between which the interpolation is done. The outputs from the fringe counting network and the A/D converter are applied to a lookup table 27 from which an output having sixteen-bit resolution and linearity is derived. In each of the above described sensor arrangements, each of the light beams which enters the coil fibre consists of two elliptical polarisation modes. These modes have different phase velocities which are preserved in the presence of small additional birefringence, such as that produced by bending or Faraday rotation, and, in this regard, the modes behave in a similar way to the modes in a linearly birefringent fibre. However, unlike linearly birefringent fibres, these modes do not have a constant polarisation, since, whilst the ellipticity of the modes is constant, the orientation of the major axes of their ellipticity varies periodically along the fibre.

The previously mentioned problem that arises from the temperature induced phase shift between the polarisation modes is obviated in the sensor of the present invention as a consequence of the counter-propagating light beams $E^+$ and $E^-$. Obviation of the temperature effect may most easily be understood by considering only one of the modes for each direction and, for simplicity, it may be assumed that the fibre has a right-handed spin pitch and that only the counter-propagating right-hand elliptical modes $E_R^+$ and $E_R^-$ are excited. Any rise in temperature will cause an identical increase in the phase velocity of both of the right-handed elliptical modes. When these elliptical modes interfere at their output their relative phase will remain unchanged and, hence, the amplitude of the combined wave will also be unchanged. Thus, a change in temperature will not affect the light intensity at the detector.

However, the sensor does remain sensitive to magnetic fields, due to the Faraday effect, since the field affects the counter-propagating beams differently- An increase in the field will cause an increase in the phase velocity of the mode travelling in the direction of the field and a decrease in the velocity of the mode travelling against the field. The modes beat at the output and, thus, the magnitude of the current can be determined as a measure of the phase shift induced by the magnetic field.

Similarly, if only the left-handed modes $E_L^+$ and $E_L^-$ are excited, the output is again unaffected by temperature change but remains sensitive to the magnetic field.

Figure 7:
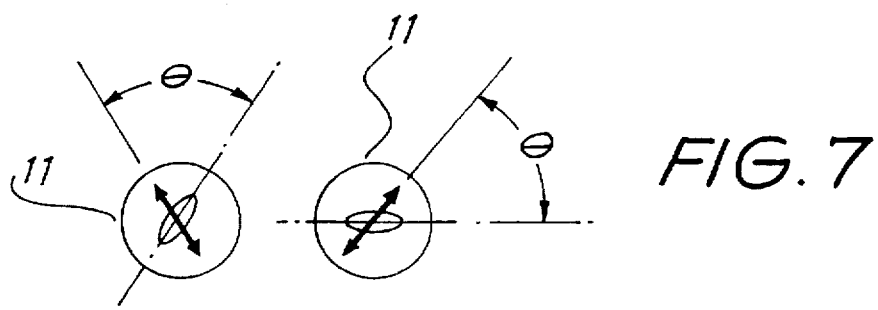
FIG. 7 shows the angular relationship desired between respective ends of an optical fibre from which a coil portion of the sensor is wound and the instantaneous polarisation of light entering the core of the fibre at its respective ends.

Since both modes in isolation behave in this way, it follows that if the same modes are excited to the same degree in both directions, the effect of changes in temperature will still be eliminated. This occurs when the polarisation of the light which is launched into the two ends of the coil fibre 11 has identical ellipticity and the same orientation relative to the end face of the fibre. This condition is illustrated in FIG. 7 of the drawings which shows the same angle θ between the major axis of the core at each end of the fibre 11 and the polarisation angle of entering light. Thus, the optical coupling between the 2×2 coupler and the ends of the coil fibre is arranged such that the angular relationship / between the coil fibre core and the polarisation of the light at any instant in time is the same at both ends of the fibre.

This may be achieved by effecting careful alignment of the ends of the fibre before splicing but, in practice, it is easier and more reliable, as above mentioned, to simply twist the complete splice where the coupler leads join the coil fibre so that the end face of the fibre is aligned with the polarisation of the light from the coupler. Since twisting the splice causes an additional small circular birefringence in the coupler leads, the splice must be twisted by an amount approximately 10% greater than that which would normally be required in making a simple comparison of the polarisation state with the orientation of the end face of the fibre.

If polarisation of the light from the coupler is not aligned at the same angle in both directions, then some proportion of the right-handed elliptical mode propagating in one direction will interfere with the left-handed elliptical mode propagating in the other direction, and this interference will be sensitive to temperature change.

I claim:

1. A current sensor comprising:
   (a) a sensor element which comprises a coil of optical fibre which is arranged for location around a current carrying conductor,
   (b) a light source arranged to emit light which is directed into and through the optical fibre,
   (c) a beam splitting device optically coupled with the light source and with ends of the optical fibre, and
   (d) a detector optically coupled to the ends of the optical fibre by way of the beam splitting device;
   wherein the optical fibre comprises spun, single mode highly birefringent optical fibre, wherein the beam splitting device is arranged to split light from the light source, to launch counter-propagating light beams into the coil by way of the ends of the optical fibre and to combine the counter-propagated light beams that emerge from the ends of the optical fibre, and wherein the detector is arranged to detect a phase shift between polarization modes of the counter-propagated light beams, the phase shift providing a measure of current flow through the conductor.

2. The current sensor as claimed in claim 1 wherein the beam splitting device is selected to exhibit low retardance relative to the optical fibre.

3. The current sensor as claimed in claim 1 wherein the optical coupling between the beam splitting device and the ends of the optical fibre is effected in a manner such that the angular relationship between the optical fibre core and the polarisation of light at any instant in time is substantially the same at both ends of the optical fibre.

4. The current sensor as claimed in claim 1 wherein the light source comprises a source of coherent or near coherent light.

5. The current sensor as claimed in claim 1 wherein the optical fibre comprises a spun stress birefringent fibre.

6. The current sensor as claimed in claim 1 wherein the optical fibre comprises a spun form birefringent fibre.

7. The current sensor as claimed in claim 1 wherein the beam splitting device comprises a 2×2 optical coupler.

8. The current sensor as claimed in claim 1 wherein the beam splitting device comprises a 3×3 optical coupler and wherein at least two detector devices are coupled to the ends of the optical fibre by the optical coupler.

9. The current sensor as claimed in claim 8 wherein the light source is coupled to the beam splitting device by way of a 2×2 coupler, wherein two of the detector devices are directly coupled to respective ones of two limbs of the 3×3 coupler and wherein a third detector device is directly coupled to one limb of the 2×2 coupler.

10. The current sensor as claimed in claim 1 wherein the detector is arranged to provide an output which is representative of an intensity of a beam resulting from interference between said counter-propagated light beams.

11. The current sensor as claimed in claim 1 and including circuitry associated with the detector which is arranged to provide an output which, in use of the current sensor, is representative of the magnitude of current flow through the conductor.

* * * * *